United States Patent [19]

Huntsinger

[11] 3,727,145

[45] Apr. 10, 1973

[54] DIGITAL MODULO COMPLEMENTARY PHASE DETECTOR

[75] Inventor: Dean P. Huntsinger, Marion, Iowa

[73] Assignee: Collins Radio Comapny, Dallas, Tex.

[22] Filed: Nov. 3, 1971

[21] Appl. No.: 195,352

[52] U.S. Cl. ..................329/104, 325/320, 325/322, 325/325, 329/110

[51] Int. Cl. ..............................................H04l 27/22

[58] Field of Search.........................329/50, 104, 110, 329/126, 137; 325/320, 325, 322; 178/66 R; 328/134

[56] References Cited

UNITED STATES PATENTS

| | | | |
|---|---|---|---|
| 3,488,440 | 1/1970 | Logan et al. | 325/325 X |
| 3,514,702 | 4/1970 | Nahay et al. | 325/320 |
| 3,493,679 | 2/1970 | Chomicki | 325/325 X |
| 3,611,298 | 10/1971 | Jacobson | 325/320 X |
| 3,675,139 | 7/1972 | Guest | 325/320 X |

OTHER PUBLICATIONS

Jones, "Digital Frequency Discriminator," IBM Tech. Disclosure, Vol. 13, No. 11, April, 1971, pp. 3421–3422.

*Primary Examiner*—Alfred L. Brody
*Attorney*—Warren H. Kintzinger et al.

[57] ABSTRACT

A digital modulo complementary noncontinuous phase detector for input signals conditioned to a pulse density representation. The detector uses one error counter and a modulo counter wherein, with counter operation, numbers added are represented as a pulse train that the error counter accumulates with the pulse total representative of numerical magnitude and error counter direction represents sign.

5 Claims, 3 Drawing Figures

DIGITAL MODULO COMPLEMENTARY PHASE DETECTOR

Figure 1:
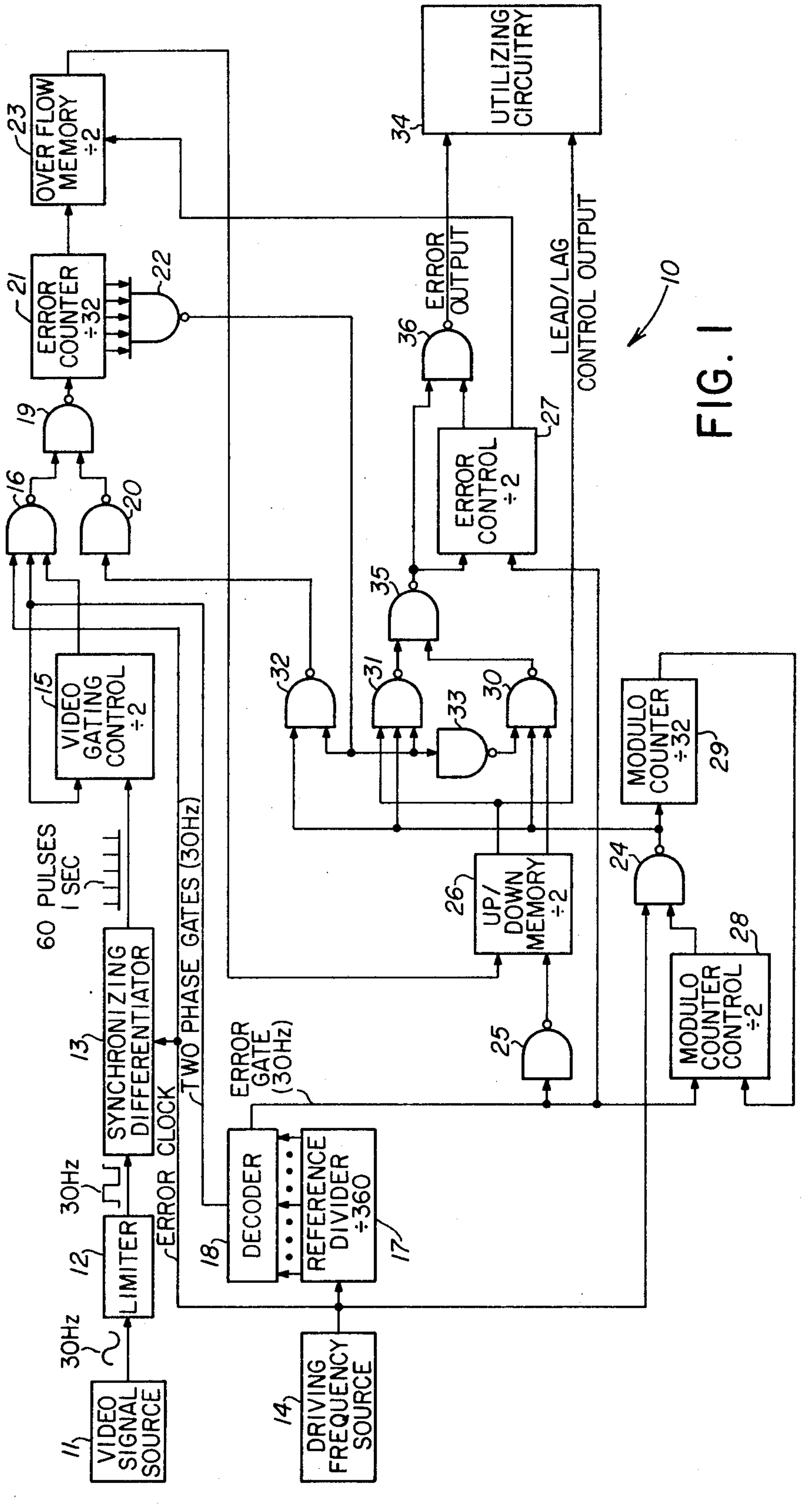

This invention relates in general to phase detection and, in particular, to a high resolution digital modulo complementary phase detector of the pulse density type implemented with digital hardware.

It is important that a digital phase detector be capable of determining the phase difference between an analog input signal and a reference input signal in a manner that does not disturb the time phase relationship of the input signals. Success or failure of a phase lock loop in a particular application depends on its stability, accuracy, insensitivity, and resolution. Digital implementation of phase detection can satisfy such requirements fundamental to phase lock loop operation particularly with high resolution pulse type phase detectors. This must be accomplished with a digital phase detector capable of determining the phase difference between an analog input, $f_{in}$, and a reference input, $f_r$, in a manner that does not disturb the time phase relationship of the input signal, $f_{in}$. With such digital phase detectors the input signal, $f_{in}$, is subject to signal condition interfacing of the analog input to digital logic circuits with signals as accomplished through a threshold detector that may impart imperfections to the resulting digital signal. Actually the output of the threshold detector may be passed through a voltage converter to achieve a resultant square wave output suitable for digital logic processing. Such limiter configurations have several problem areas such as that of hystersis with a differential threshold between positive and negative trigger points, and the comparison point against which the threshold detector determines the zero crossing voltage of the input resulting in the positive portions of the resulting square wave being of greater or lesser duration then the negative portions. Further, some conventional methods of phase detection require calculation for the full 360° of each cycle of the signal waveform and require considerable hardware. Still further, such phase detectors do not allow time during each cycle to operate on error calculated to adjust phase of the reference signal in a closed loop system and increases hardware requirements.

It is, therefore, a principal object of this invention to provide a digital phase detector having a reliable operation, facilitating complete performance integrity with aging, and that requires few adjustments.

Another object with such a digital phase detector is to be capable of detecting phase error through a relatively small angle of each cycle of a signal waveform.

A further object is to provide such a digital phase detector allowing time during each cycle to operate on error calculated in adjusting phase of the reference signal.

Another object is to provide a detector with the incoming signal sliced and then differentiated to present zero crossing pulses from which phase differential is calculated.

Still a further object is to so phase detect process the sliced and differentiated signal as to ignore distortion introduced by signal slicing as if no distortion were present.

A further object is to avoid signal slicing introduced and processing distortion via a digital modulo utilizing complementary phase detector.

Features of the invention useful in accomplishing the above objects include, in a digital modulo complementary phase detector, utilization of a residue modulo in a noncontinuous type detector well suited to phase lock loop applications. It is a digital phase detector of the pulse density type using one main error counter and a modulo counter wherein, with counter operation, numbers added are represented as a pulse train that the error counter accumulates. The number of pulses are representative of the numerical magnitude and the error counter direction is representative of sign in operation as a pulse density system. The modulo counter is utilized as a stop-start counter under supervision of the modulo control circuit that limits the range of operation to R. With the counter started to count a frequency, $f_d$ (driving frequency), until an input signal, $f_{in}$, commands the operation to stop, the result is indicative of the time differential to a resolution of the frequency counted. Detection of the error counter passing the ½ R state during operation yields sign information. It is a system effectively achieving coherent even harmonic rejection with detection utilizing both the 0° and 180° zero crossings of the input signal, $f_{in}$, to cancel limiter distortion. Detection and counter usage both operate twice in a cycle with, during detection, the midpoint being actually the counter end point when both operations are accumulated. The readout modulo becomes the counter modulus, R, and occurs after both detection operations transpire resulting in an apparent gain of 2.

A specific embodiment representing what is presently regarded as the best mode of carrying out the invention is illustrated in the accompanying drawings.

Figure 2:
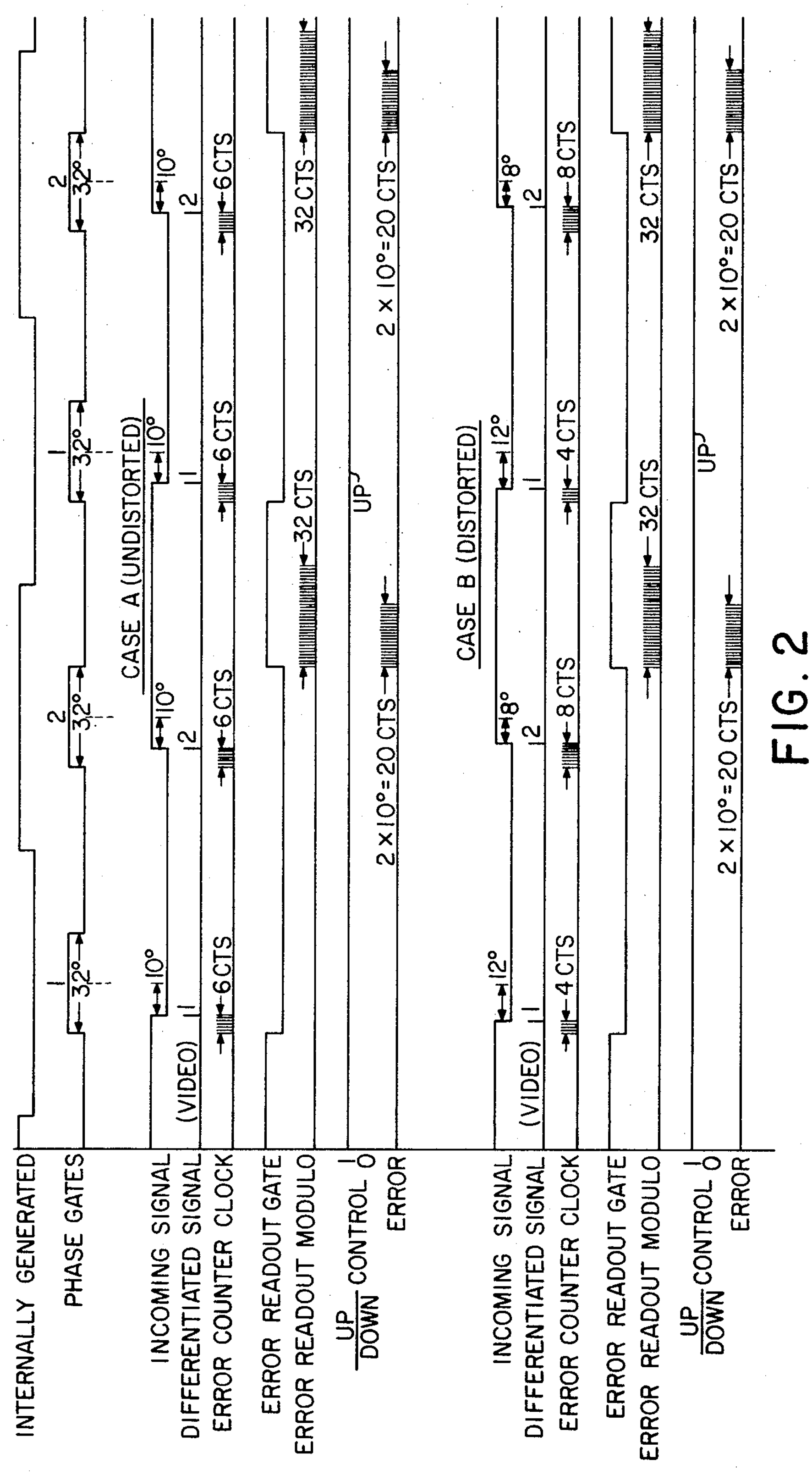
Figure 3:
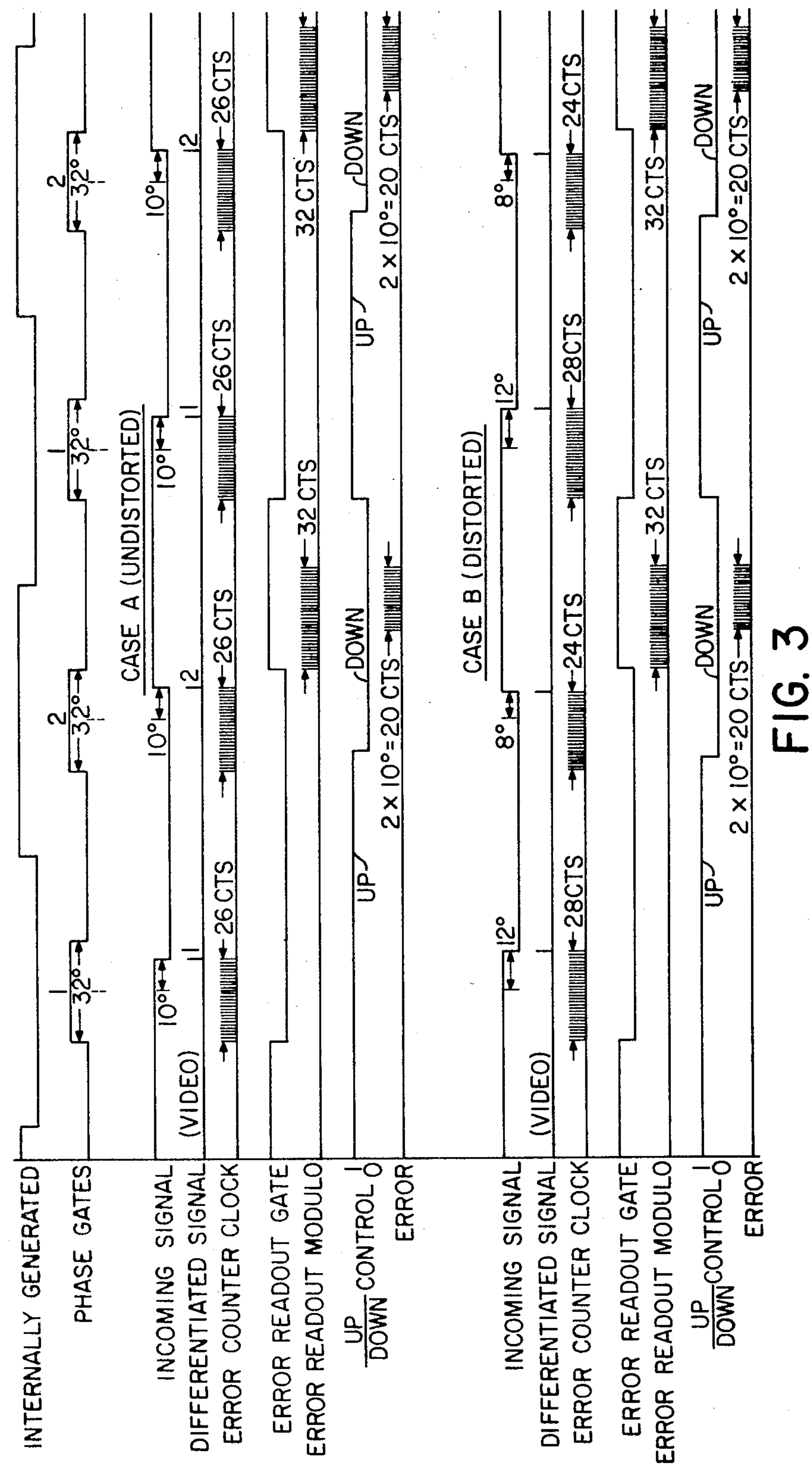

In the drawings:

FIG. 1 represents a combination block-schematic of a digital modulo complementary phase detector in accord with applicant's teachings;

FIG. 2, a waveform family for the digital modulo complementary phase detector of FIG. 1 where the incoming signal is leading the reference signal by 10° for both the undistorted state (Case A) and a distorted state (Case B); and FIG. 3, a waveform family, quite similar to FIG. 2, where the incoming signal lags the reference by 10° for both the undistorted state (Case A) and a distorted state (Case B).

Referring to the drawings:

The digital modulo complementary phase detector 10 of FIG. 1 is shown to have a 30 Hz input sine wave signal from video signal source 11 processed through limiter circuit 12 to a 30 Hz square wave signal applied as an input to synchronizing differentiator circuit 13. The limiter circuit 12, as an analog to digital signal converter, may include both a threshold detector and a voltage converter in a conventional manner for producing the resultant 30 Hz square wave signal input to the synchronizing differentiator circuit 13. The synchronizing differentiator circuit 13 also receives a driving frequency, $f_d$, input of 10.8 KHz as an error clock signal from driving frequency signal source 14. A resulting 60 pulse per second, or 60 Hz microsecond duration differentiated signal pulse waveform, is applied from the synchronizing differentiator circuit as an input to video gating control divide by two flip-flop circuit 15 that develops a gating control output applied as an input to three input NAND gate 16.

The driving frequency signal, $F_d$, is also applied as a 10.8 KHz input signal to reference divider circuit 17 that develops a plurality of binary coded decimal (BCD) outputs such as successive divide by ten sections and finally a divide by four section giving 1.0°, 10° and 100° resolution inputs to decoder circuit 18 including a 30 Hz reference signal. Two resulting phase gates per cycle of the 30 Hz input signal and of the 30 Hz internally generated reference signal are generated such as shown in FIGS. 2 and 3, a number 1 gate and a number 2 gate generated within the decoder circuit 18, are applied as inputs to both video gating control circuit 15 and NAND gate 16. These two gates of 32° duration each are time-phase centered number 1 gate about the center of the down half, and number 2 gate about the center of the up half of each square wave cycle of the internally generated 30 Hz reference signal. The resulting divided by two video gating control flip-flop circuit 15 output with the 60 pulses per second input from synchronizing differentiator 13 creates a gate 16 input that permits the 10.8 KHz error clock signal to pass from the beginning of each phase gate until the next respective zero crossing of the 30 Hz input signal. This gated clock signal is passed as an input to two input NAND gate 19. The other input to NAND gate 19 is a modulo flow input passed through inverter NAND gate 20 until the error counter divide by 32 circuit 21 reaches overflow. The output of NAND gate 19 is connected as the input to divide by 32 error counter circuit 21 having a plurality of count output connections to NAND gate 22 and a full count output connection to divide by two overflow memory circuit 23.

The driving frequency, $f_d$, source 14 also has a 10.8 KHz signal connection as an input to NAND gate 24. The error gate signal output of decoder circuit 18 is connected through inverter NAND gate 25 as an input to divide by two up-down memory flip-flop 26 also receiving as an input the output of divide by two overflow memory flip-flop 23. The decoder circuit 18 error gate output is also connected as an input to both divide by two error control flip-flop 27 and divide by two modulo counter control flip-flop 28. The error readout modulo output of NAND gate 24 is connected as an input to divide by thirty-two modulo counter 29 having an output connection in a loop back to a reset terminal of divide by two modulo counter control flip-flop 28. The error readout modulo output of NAND gate 24, in addition to the loop connection to modulo counter 29, is connected as an input to three input NAND gates 30 and 31, and as an input to two input NAND gate 32. The other input to NAND gate 32 is from the output of NAND gate 22, also connected as an input to NAND gate 31 and through inverter NAND gate 33 as an input to NAND gate 30. The output of NAND gate 32 is the modulo flow input inverted through NAND gate 20 to NAND gate 19 until the error counter divide by 32 circuit 21 reaches overflow in each cycle. The output of overflow memory flip-flop 23 is connected as the set input to up-down memory flip-flop 26 and the Q up-down control output is connected as an input to NAND gate 31 and also as the lead/lag control output connection to utilizing circuitry 34. The $\bar{Q}$ output of up-down memory flip-flop 26 is connected as an input to NAND gate 30 that, along with NAND gate 31, has an output connection to NAND gate 35 having an output connection as the set input of error control flip-flop 27 and also as an input to two input NAND gate 36. The $\bar{Q}$ output of error control flip-flop 27 is connected as an input to overflow memory 23 while the Q output, as a logic gate interval control to allow 10 clock counts to pass, is connected as an input to NAND gate 36 with the other input from NAND gate 35 being error logic equivalent to 20 clock counts to produce the error output applied to utilizing circuitry 34.

In operation the digital modulo complementary phase detector 10 of FIG. 1 detects the phase differential between two waveforms, an internally generated waveform as a reference from which the phase detector is controlled, and an incoming signal passed through a slicer and then differentiated to present zero crossing pulses from which the phase differential is calculated. The phase detector operates in such a manner as to process the incoming signal with any distortion introduced by the slicer being canceled out as though no distortion were present. The digital modulo complementary phase detector shown is operationally quite useful in an application where the internally generated waveform is to be phase locked to the incoming signal. With the incoming signal variable the signal must be brought into the phase gates of the detector if the incoming variable signal is not initially in the phase gates of the detector. This is readily accomplished by sensing that the variable zero crossing pulses of the video are not in the phase gate and forcing the reference loop to a phase that inserts the videos into the phase gates. Ambiguity of 180° is readily resolved by calling the zero crossing at 0° video 1 and that at 180° video 2. The phase gates may also be referred to as gate 1 and gate 2 and detection occurs only when video 1 is in phase gate 1 and in like manner for video 2 being in phase gate 2. The phase gates are derived from the internally generated reference signal as an indication of the reference signal phase and an error gate is also derived from the reference signal for a phase detection cycle in operation of the detector 10.

With the phase detector 10 including an error counter 21, modulo counter 29, and associated circuitry, as shown in FIG. 1, each phase gate signal presents an error clock to the error counter 21 of required resolution, in the illustrated example 1° per clock pulse. The video signal pulse corresponding to the proper phase gate will stop the clock when it occurs. Thus, the error counter counts error clock from the leading edge of the phase gate to the proper video signal pulse. Since there are two phase gates in 360° of the reference signal, the error counter 21 is called upon to count twice during each signal cycle. If the error counter is the same length 32 pulse counts as the phase gate 32°, 1° per pulse count, distortion, if any, presented by the slicer on the incoming signal is eliminated by computing the phase error at both zero crossings before deriving the net utilized result. The detector thus creates an error readout with a gain of two. Should the videos be in the latter half of the phase gate, in other words the down side, the error counter will overflow giving an indication thereof that is stored in the up/down memory circuit 26. Then when the error readout gate occurs, the modulo clock is initiated and clocks the error counter 27 to its full count that thereupon stops the error counter from counting. Thus, the number of counts is indicative of the error calculated. Should the videos occur in the early half of the phase gates, that is the up half, the up/down memory will be up, and the number of clocks readout as error will be the same as the number of clocks required to count the error counter to 32. Should the videos occur in the down half of the phase gates, the up/down memory will be down because the error counter overflowed during calculation, and the number of clocks readout as error will be the modulo complement of the number of clocks required to count the error counter to 32. Thus, the modulo counter is required to be 32 counts long just as is the error counter and phase gates. Further, the overflow memory circuit 23 is capable of handling the case, as is a capability requirement, where there are no videos in the phase gates and the error counter overflows twice, and prevents an extraneous error from being read out. Actually, consistent with what has been stated before, the error clock should be 180° out of phase with the clock that creates the phase gates to prevent extraneous error from being readout when the videos occur at the leading edge of the phase gates. This causes the null point of the phase detector to be one half of an error clock period from the center of a phase gate. Videos should also be prevented from occurring on the trailing edge of the phase gates for this is also a null point, in other words, a point of zero error read out.

Referring also to FIG. 2 and, in particular Case A thereof illustrating an undistorted income signal that is leading the reference signal by 10°, with this undistorted signal Case A the error counter counts to six in each phase gate thus resulting in a count of 12 for each signal cycle. The error counter 21 has not overflowed during calculation and, therefore, the up/down memory 26 indicates that the videos were in the up half of the readout gate. When the error readout gate occurs, the readout modulo is generated, and since the error is up, the number of clocks readout is the same and the number of clocks required to count the error counter to 32, 32 – 12, or 20 counts which is 2 × 10°. Referring now to the distorted signal Case B of FIG. 2, where the phase differential is nominally the same as with Case A of FIG. 2, the input signal slicer has caused distortion in the signal out of the synchronizing differentiator 13. In this case the error readout is still 20; that is, 2 × 10°. This is with a trailing edge lead of 12° and a leading edge lead of 8° resulting in alternate error counter clocks of 4 counts and 8 counts that still result in a net error readout of 20 counts.

Referring also to FIG. 3 and, in particular the undistorted input signal Case A thereof, with the incoming signal lagging the reference signal by 10° the error counter counts to 26 in each phase gate. The up/down memory circuit 26 is then set to down in each signal cycle when the error counter overflows during each calculation cycle. The error readout gate causes the readout modulo to be generated and since the preceding videos were in the down side of the gate the modulo complement of the number of clock pulses required to count the error counter to 32 is read out as error. Since the error counter counted 52 counts and is a modulo 32 counts long, there are 20 counts left. Since it then takes 12 more counts to count to 32 and the modulo is 32 counts, the 32 minus 12 counts result in the 20 counts left to be readout as error or 2 × 10°. The FIG. 3B distorted signal case illustrates the various waveform states that result from a distorted income signal having edges lagging by 12° and 8° in each cycle. Here again just as with the FIG. 2 Case B distorted state, the error readout results of 2 × 10° or 20 counts is the same as attained with the Case A undistorted state.

Thus there is provided a digital modulo complementary phase detector capable of detecting phase error in such a manner as to require only a relatively small angle of the input waveform, in the illustrated example an angle of only 64°. Generally known conventional methods require calculation for the full 360° of the waveform and require considerably more hardware. The digital modulo complementary phase detector also allows time during each cycle to operate on the error calculated to, when used in a loop, adjust the phase of the reference signal, a further capability that conventional methods generally do not have. The phase detector also has the capability of accepting distortion introduced by a signal slicer acting on the incoming waveform and canceling such distortion out in deriving the resultant error readout.

Whereas this invention is here illustrated and described with respect to a specific embodiment hereof, it should be realized that various changes may be made without departing from the essential contributions to the art made by the teachings hereof.

I claim:

1. A noncontinuous digital modulo complementary phase detector comprising:

a. gating control means, b. error counter means, c. overflow memory means connected to said error counter means, d. modulo counter means, e. error output gating means, f. reference frequency means, g. decoder means interconnected with said reference frequency means and applying two phase gate signals per input signal frequency to said gating control means, h. differentiator means interconnected to receive an input signal and apply a differentiated input signal to said gating control means, i. said gating control means being responsive to application of said gate signals and applying clock signals from said reference frequency means to said error counter means until receipt of a differentiated input signal during said gate period, j. means interconnecting said error counter means and said modulo counter means to said error output gating means and responsive to an error gate signal to produce an error count output, and k. up/down memory means interconnected with said overflow memory means and said error output gating means for indicating sign of said error count output.

2. A noncontinuous digital modulo complementary phase detector as defined by claim 1 wherein said differentiator means comprises a limiter and a differentiator synchronized with said clock signals.

3. A noncontinuous digital modulo complementary phase detector as defined by claim 1 wherein said decoder means comprises a reference divider for developing a plurality of binary coded decimal outputs and a decoder circuit means responsive to said binary coded decimal outputs and generating said phase gate signals and said error gate signal.

4. A noncontinuous digital modulo complementary phase detector as defined by claim 1 wherein said modulo counter means includes a two input NAND gate, a modulo counter, a set/reset modulo counter control, means connecting the set output of said modulo counter control to one input of said gate, means connecting said reference frequency to the other input of said gate, means connecting the output of said gate to the input of said modulo counter, and means connecting the output of said modulo counter to the reset input of said counter control.

5. A noncontinuous digital modulo complementary phase detector as defined by claim 1 wherein said differentiator means comprises a limiter and a differentiator synchronized with said clock signals; said decoder means comprises a reference divider for developing a plurality of binary coded decimal outputs and a decoder circuit means responsive to said binary coded decimal outputs and generating said phase gate signals and said error gate signal; and said modulo counter means includes a two input NAND gate, a modulo counter, a set/reset modulo counter control, means connecting the set output of said modulo counter control to one input of said gate, means connecting said reference frequency to said other input of said gate, means connecting the output of said gate to the input of said modulo counter, and means connecting the output of said modulo counter to the reset input of said counter control.

* * * * *